(12) United States Patent
Inoshita et al.

(10) Patent No.: US 6,477,115 B1
(45) Date of Patent: Nov. 5, 2002

(54) SEMICONDUCTOR INTEGRATED CIRCUIT

(75) Inventors: Chizuru Inoshita, Tokyo (JP); Kazuo Aoki, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 261 days.

(21) Appl. No.: 09/627,452

(22) Filed: Jul. 27, 2000

(30) Foreign Application Priority Data

Mar. 3, 2000 (JP) ........................................ 2000-058898

(51) Int. Cl.$^7$ ......................... G04F 10/00; H03K 19/00; G01R 31/28
(52) U.S. Cl. ......................... 368/120; 326/16; 714/724; 714/734
(58) Field of Search .................. 368/113–120; 324/73.1; 326/16, 37–38, 41; 327/292; 714/724, 734

(56) References Cited

U.S. PATENT DOCUMENTS

5,578,938 A * 11/1996 Kazami .................. 326/16
6,005,829 A * 12/1999 Conn ....................... 368/118
6,020,760 A1 * 2/2001 Sample et al. ............ 326/41

FOREIGN PATENT DOCUMENTS

JP 10-74841 3/1998
TW 89-11396 1/1997

* cited by examiner

*Primary Examiner*—Vit Miska
(74) *Attorney, Agent, or Firm*—Leydig, Voit & Mayer, Ltd.

(57) ABSTRACT

In a semiconductor integrated circuit, a monitor circuit for evaluation is provided on a semiconductor substrate in an input/output buffer circuit region. This monitor circuit includes a delay circuit, a first flip-flop circuit on the input side of the delay circuit, and a second flip-flop circuit on the output side of the delay circuit.

19 Claims, 13 Drawing Sheets

Nch:Pch=1:1

Nch:Pch=4:1

Nch:Pch=1:4

MEASURE N-CHANNEL TRANSISTER
WHEN TRANSMITTED DATA IS "H"

MEASURE P-CHANNEL TRANSISTER
WHEN TRANSMITTED DATA IS "L"

SEMICONDUCTOR INTEGRATED CIRCUIT

FIELD OF THE INVENTION

The present invention relates to a semiconductor integrated circuit (IC) having a complementary metal oxide film semiconductor element (CMOS) structure. More particularly, this invention relates to a semiconductor integrated circuit comprising a monitor circuit for evaluation used to determine characteristics of a manufacturing process of the semiconductor integrated circuit.

BACKGROUND OF THE INVENTION

These days an IC tester is widely used to identify defective products during the production of CMOS-ICs, in order to produce ICs on a large scale and improve productivity. Various defective product identification (testing) methods are known that use the IC tester. For example, one method for evaluating the state of the transistor characteristics and interconnections (AL interconnections) is achieved by evaluating the operating speed of the IC. The operating speed of the IC should preferably be evaluated by testing the functions at the actual operating frequency of the IC being evaluated.

However, the present day ICs function at increasingly higher speeds and are highly integrated. Consequently, it has been extremely difficult to carry out a function test at the actual operating frequency due to the load when creating a test vector for the function test at the actual operating frequency (the level of difficulty in creating the vector, the time required to create the vector, etc.), and the ambiguity of the created test vector, and the like. Another method for testing this type of high-speed, highly-integrated IC is to measure the data signal transmission time (delay time) of a path comprising multiple gates within the IC.

This delay time is measured either by using a given path in the built-in logical circuit of the IC, or by providing a delay monitor circuit for evaluating the operating speed in the IC. This method measures the time taken for an input data signal to travel along the path or through the delay monitor circuit, evaluates the condition of the transistor characteristics and interconnections (AL interconnections) and thereby detects the defective products. FIG. 19 shows a circuit constitution of a conventional delay monitor circuit.

This delay monitor circuit 50 is provided between an input circuit 51, which is connected to a test terminal for data signal input IN, and an output circuit 52, which is connected to a test terminal for data signal output OUT. The delay monitor circuit 50 comprises a delay circuit 54 which in turn comprises many delay elements 53, such as inverters, connected in series. When measuring the delay using the delay monitor circuit 50, a data signal for testing is input from the test terminal for data signal input IN. This data signal passes through the input circuit 51, the delay circuit 54, the output circuit 52, and is output from the test terminal for data signal output OUT. The time taken for the data signal to travel from the input circuit 51 to the output circuit 52 is measured as the delay time.

FIG. 20 is a diagram showing a circuit constitution of another conventional delay monitor circuit. In addition to the delay monitor circuit 50 shown in FIG. 19, the delay monitor circuit 56 further comprises a NAND gate 55 provided between the input circuit 51 and the delay circuit 54. A ring oscillator is formed by feeding back the last-stage output of the delay circuit 54 to one of the input terminals of the NAND gate 55. In this delay monitor circuit 56, the delay time is evaluated by measuring the oscillating frequency of the ring oscillator.

FIG. 21 is a diagram showing the chip arrangement of a conventional semiconductor integrated circuit (IC). This IC comprises a built-in logical circuit region 61, an input buffer circuit region for test terminal 63, an output buffer circuit region for test terminal 64, input/output buffer circuit regions 66 other than the input buffer circuit region for test terminal 63 and the output buffer circuit region for test terminal 64, and pads (PAD) 65 provided in each of the input/output buffer circuit regions.

In this IC, the input circuit 51 and output circuit 52 shown in FIG. 19 and FIG. 20 are provided in the input buffer circuit region for test terminal 63 and in the output buffer circuit region for test terminal 64 respectively, and the delay monitor circuits 50 and 56 shown in FIG. 19 and FIG. 20 are provided in the regions 62 of the built-in logical circuit region 61. The delay time is evaluated using the delay monitor circuits 50 and 56.

However, according to the conventional semiconductor integrated circuits using the delay monitor circuit 50 described above, the measured delay time also includes the delay times of the input and output circuits 51 and 52. Consequently, there is a disadvantage that, since the effect of the delay times in the input and output circuits 51 and 52 must be taken into consideration, the precision of the evaluation of the semiconductor integrated circuit is reduced. Furthermore, according to the conventional semiconductor integrated circuit using the delay monitor circuit 56 (ring oscillator) described above, since the delay time is evaluated by measuring the oscillating frequency, it is only possible to measure the average operating speeds of all the P-channel transistor and the N-channel transistor present inside all the delay elements. That is, since it is not possible to separately monitor the P-channel transistors and the N-channel transistors, there is a disadvantage that detailed process characteristics cannot be evaluated.

Furthermore, according to the conventional semiconductor integrated circuit which uses the delay monitor circuit 50 and the semiconductor integrated circuit which uses the delay monitor circuit 56 (ring oscillator) described above, since the delay monitor circuits are provided in built-in logical circuit regions of the IC, the design region of the built-in logical circuit is reduced, resulting in disadvantages of increased limitations on providing interconnections, and increased costs. Furthermore, since the elements forming the delay monitor circuits are arranged unevenly in the built-in logical circuit regions of the IC, the effect of the transistor characteristics and the interconnections on the speed become unclear. Resultantly, the precision of the evaluation of the semiconductor integrated circuit is reduced.

SUMMARY OF THE INVENTION

It is an object of this invention to provide a semiconductor integrated circuit which can be evaluated at high precision and in great detail, and wherein the design region of a built-in logical circuit can be reduced, and costs can be lowered without increasing restrictions on the arrangement of the interconnections.

In order to solve the above problems and achieve the objects, the semiconductor integrated circuit according to this invention comprises a monitor circuit for evaluation on a semiconductor substrate, the monitor circuit being provided in an input/output buffer circuit region of the semiconductor integrated circuit. This monitor circuit comprises a delay circuit, a first flip-flop circuit, and a second flip-flop circuit. The first and second flip-flop circuits are connected to an input stage and an output stage of the delay circuit respectively. Because of such a structure, the P-channel transistors and the N-channel transistors can be individually monitored without being affected by the delay of the input/output circuits, and the monitor circuit need not be provided in the built-in logical circuit region.

Further, many and different types of monitor circuits are provided, and each type of monitor circuit has a different type of delay circuit. Thus, since each of the multiple monitor circuits of multiple types has a different type of delay circuit, a single semiconductor integrated circuit can be evaluated using a variety of delay circuits.

Further, the monitor circuit is provided in a ring around the top face of the semiconductor substrate. Therefore, it is possible to form a monitor circuit which is longer than one provided at the sides. In addition, the guides for the clock signal which drives the first and second flip-flop circuits in the input and output stages can be shortened.

Further, the monitor circuit can extract an output from midway through the delay circuit. Therefore, characteristics of the transistors in the semiconductor integrated circuit and variations in the state of the interconnections can be evaluated. Furthermore, fewer test terminals need be provided in the package than when multiple monitors are used.

Further, the size of the transistors comprising the delay circuit is the same as the size of the transistors comprising the built-in logical circuit of the semiconductor integrated circuit. Therefore, the semiconductor integrated circuit can be evaluated under conditions which are closer to the built-in logical circuit.

Further, the monitor circuit comprises many types of delay circuits having interconnections of different lengths between their delay elements. Therefore, it is possible to evaluate the effect of the length of the interconnections on the speed of the semiconductor integrated circuit.

Further, the monitor circuit has a delay circuit in which fixed-length interconnections are appended between the delay elements, and a delay circuit in which the interconnections between the delay elements are as short as possible. Therefore, it is possible to evaluate the effect of the length of the interconnections on the speed of the semiconductor integrated circuit.

Further, power for the monitor circuit is provided separately from the power for the built-in logical circuit of the semiconductor integrated circuit and the power for the input/output buffer circuit of the semiconductor integrated circuit. Therefore, the effect on the monitor circuit of noise and the like from the built-in logical circuit and the input/output buffer circuit can be reduced.

Further, the input/output buffer circuits and the pads for the monitor circuit are provided at corners of the semiconductor integrated circuit. Therefore, when no evaluation is required after packaging, the number of test terminals in the package can be reduced.

Other objects and features of this invention will become apparent from the following description with reference to the accompanying drawings.

DESCRIPTION OF THE PREFERRED EMBODIMENTS

Preferred embodiments of the semiconductor integrated circuit according to the present invention will be explained based on the diagrams. However, this invention is not limited to the following embodiments.

In the semiconductor integrated circuit (IC) according to a first embodiment of the present invention, a delay monitor circuit for evaluating the operating speed of the IC is provided in input/output control circuit regions of multiple input/output buffer circuit regions, and not in built-in logical circuit regions. Launcher flip-flop circuits (L-FF circuit) and capture flip-flop circuits (C-FF circuit) are connected to the input stage and output stage of the gate delay circuit of the delay monitor circuit. These flip-flops are operated by a single clock, enabling the transmission speed of an input data signal to be measured. The constitution of the first embodiment will be explained below.

Figure 1:
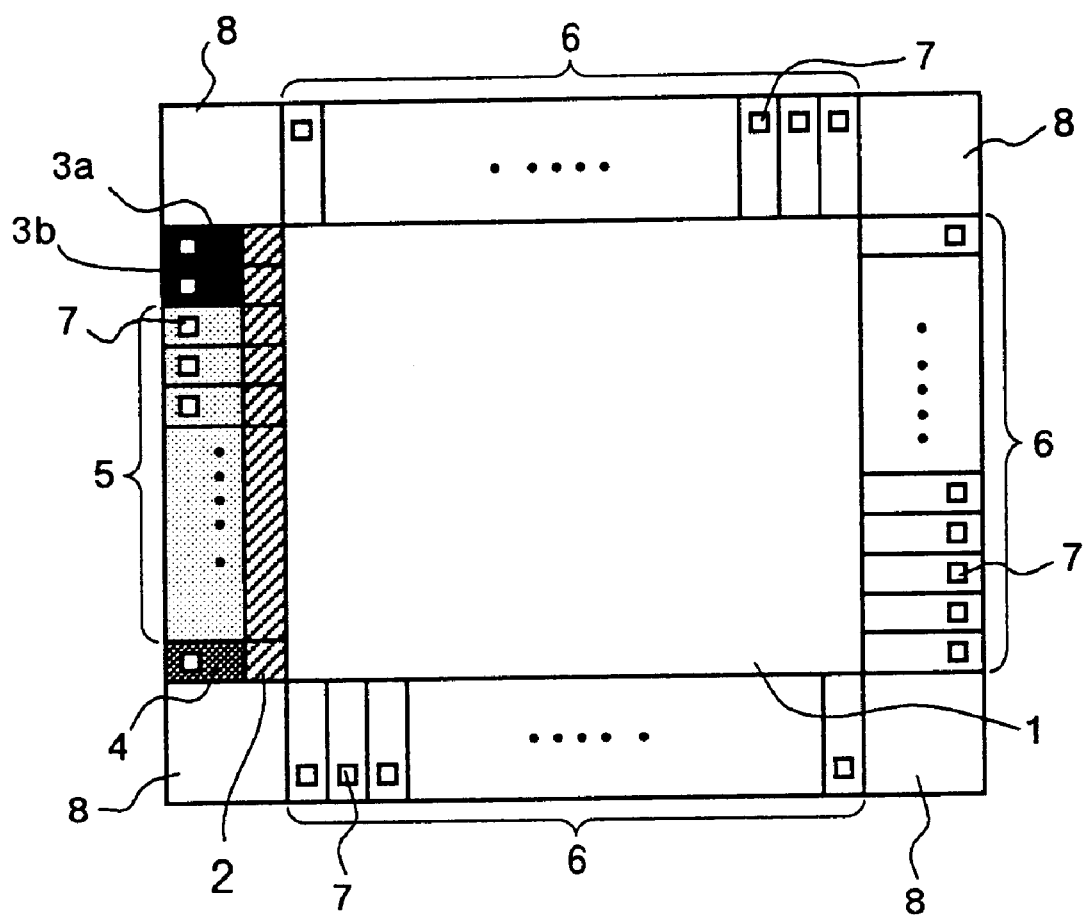
FIG. 1 is a diagram showing a chip arrangement of a semiconductor integrated circuit according to a first embodiment of the present invention.

FIG. 1 is a diagram that shows a chip arrangement of the IC according to the first embodiment of this invention. This IC comprises a built-in logical circuit region 1 comprising a built-in logical circuit, an input/output control circuit region 2 comprising an input/output control circuit and elements forming a delay monitor circuit described later, input buffer circuit regions 3a and 3b comprising input circuits for test terminal, an output buffer circuit region 4 comprising an output circuit for test terminal, an input/output buffer circuit region 5 comprising input/output circuits (an input circuit, an output circuit, and a bi-directional circuit) and having an input/output control circuit region 2, an input/output buffer circuit region 6 comprising ordinary input/output buffers other than those in the input/output buffer circuit region 5, pads (PAD) 7 provided in each of the input/output buffer circuit regions, and corners 8 of the IC.

In this IC, a delay monitor circuit is provided, not in the built-in logical circuit region 1, but in the input/output control circuit region 2 of the input and output buffer circuit regions 3a, 3b, 4, and 5. That is, the input/output control circuit region 2 acts as a delay monitor circuit region containing the delay monitor circuit. The input and output buffer circuit regions 3a, 3b, 4, and 5 are at least provided at sides of the IC so that the input buffer circuit regions 3a and 3b and the output buffer circuit region 4 are on either side of the input/output buffer circuit region 5. The input and output buffer circuit regions 3a, 3b, 4, and 5 may be provided on part of one side, or spread over multiple sides. That is, the delay monitor circuit may be provided in an input/output buffer circuit region in part of one side, or spread over multiple sides.

Figure 2:
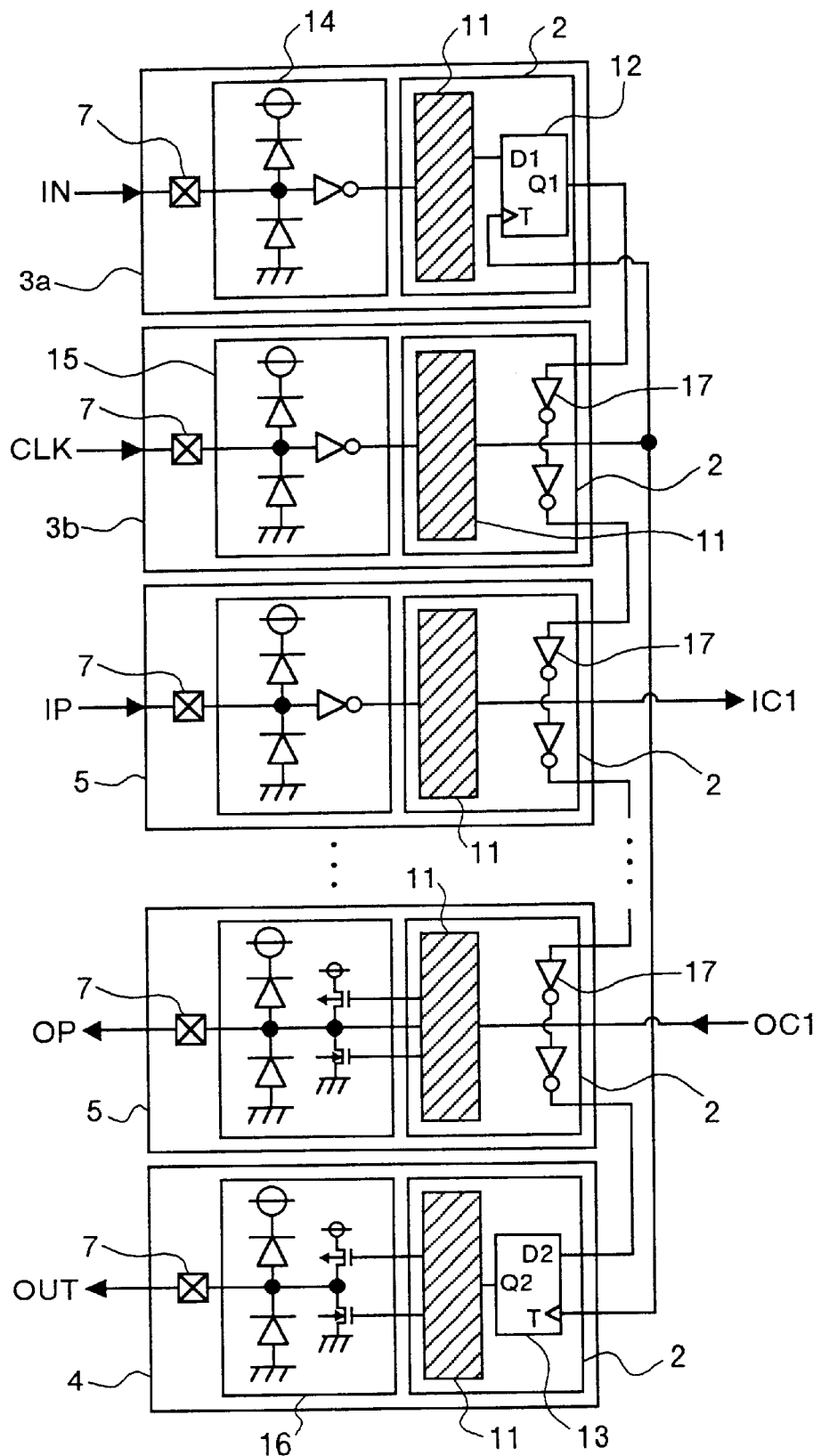
FIG. 2 is a diagram showing an input/output buffer circuit region according to the first embodiment.

FIG. 2 shows a schematic constitution of the input and output buffer circuit regions 3a, 3b, 4, and 5 shown in FIG. 1. A pad 7 connected to the test terminal IN for data signal input, an input circuit 14 connected to input terminal of the pad 7 and having an static-electricity protector, a launcher flip-flop circuit(L-FF circuit) 12, and an input/output control circuit 11 connected to the output terminal of the input circuit 14 and a data input terminal D1 of the L-FF circuit 12, are provided in the input buffer circuit region 3a.

Furthermore, a pad 7 connected to a test terminal OUT for data signal output, an output circuit 16 comprising an static-electricity protector of which the output terminal is connected to the pad 7, a capture flip-flop circuit (C-FF circuit) 13, and an input/output control circuit 11 connected to the input terminal of the output circuit 16 and a data output terminal Q2 of the C-FF circuit 13, are provided in the output buffer circuit region 4.

Furthermore, a pad 7 connected to a test terminal CLK for inputting a clock signal, an input circuit 15 comprising an static-electricity protector circuit of which the input terminal is connected to the pad 7, an input/output control circuit 11 connected to clock input terminals T of the L-FF circuit 12 and the C-FF circuit 13, and to the output terminal of the input circuit 15, and a delay element 17 comprising a delay circuit provided between a data output terminal Q1 of the L-FF circuit 12 and a data input terminal D2 of the C-FF circuit 13, are provided in the input buffer circuit region 3b.

Furthermore, a pad 7 connected to terminals for input and output IP and OP, an input circuit or an output circuit comprising an static-electricity protector and connected to the pad 7, an input/output control circuit 11 connected between the input/output circuit and a built-in logical circuit, and a delay element 17 comprising a delay circuit provided between a data output terminal Q1 of the L-FF circuit 12 and a data input terminal D2 of the C-FF circuit 13, are provided in the input/output buffer circuit region 5.

The input circuit 14 receives a data signal for testing, and the input circuit 15 receives a clock signal for testing. The L-FF circuit 12 receives the data signal from the input circuit 14 and the clock signal from the input circuit 15, and outputs the data signal at the timing stipulated by the clock signal. The delay elements 17 provided in the input/output control circuit regions of the input/output buffer circuit regions 3b and 5 are connected in series, and transmit the data signal from the L-FF circuit 12 to the C-FF circuit 13. The C-FF 13 receives the data signal from the delay element 17 and the clock signal from the input circuit 15, and outputs the data signal at the timing stipulated by the clock signal. The L-FF circuit 12, the C-FF circuit 13, and the delay element 17 together comprise a delay monitor circuit for evaluating the operating speed of the IC.

Figure 3:
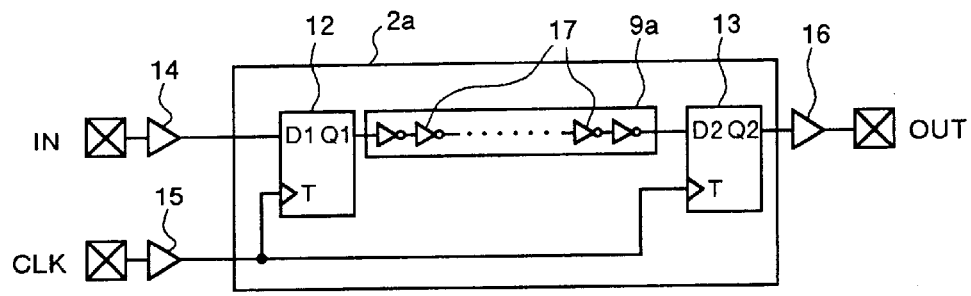
FIG. 3 is a diagram showing a delay monitor circuit according to the first embodiment.

FIG. 3 shows a circuit constitution of the delay monitor circuit according to this embodiment. This delay monitor circuit 2a comprises the L-FF circuit 12 and the C-FF circuit 13, which are operated by a single clock, and a delay circuit 9a comprising many delay elements 17 connected in series between the L-FF circuit 12 and the C-FF circuit 13. In the delay monitor circuit 2a, the delay time of the delay circuit 9a can be evaluated by verifying whether the data signal has been correctly transmitted between the L-FF circuit 12 and the C-FF circuit 13. The delay elements 17 of the delay circuit 9a may, for example, all comprise inverters, or may comprise NAND gates, AND gates, NOR gates, OR gates, and the like, or a combination of these.

The operation of the first embodiment having a constitution as described above will be explained. In the operation of the first embodiment, the delay time of the delay circuit 9a (i.e. the verification of the transmission of the data signal for evaluating the IC) is evaluated by inputting a test vector for testing (a data signal and a clock signal for testing) to the test terminals for input IN and CLK, monitoring the data signal output from the test terminal for output OUT, and determining whether the data signal has been correctly transmitted from the L-FF circuit 12 via the delay circuit 9a to the C-FF circuit 13.

To begin with, the data signal input into the test terminal for data signal input IN passes through the input circuit 14 of the input buffer circuit region 3a and the input/output control circuit 11, and is input into the data input terminal D1 of the L-FF circuit 12. The clock signal input from the test terminal CLK for inputting the clock signal passes through the input circuit 15 of the input buffer circuit region 3b and the input/output control circuit 11, and is input into the clock input terminals T of the L-FF circuit 12 and the C-FF circuit 13.

In the L-FF circuit 12, the clock signal input into the clock input terminal T latches the data signal input into the data input terminal D1, and the latched data signal is output from the data output terminal Q1. The data signal output from the data output terminal Q1 of the L-FF circuit 12 is input into the delay elements 17 provided in the input/output control circuit region 2 of the input buffer circuit region 3b, and is also sequentially transmitted though the delay elements 17 provided in the input/output control circuit region 2 of the multiple input/output buffer circuit regions 5.

When the data signal has passed through the delay circuit 9a having many delay elements 17, it is then input into the data input terminal D2 of the C-FF circuit 13, and latched by the clock signal input into the clock input terminal. The latched data signal is output from the data output terminal Q2 of the C-FF circuit 13, passes through the input/output control circuit 11 and the output circuit 16 of the output buffer circuit region 4, and is output to the outside from the test terminal for data signal output OUT. By monitoring the data signal, it is possible to evaluate the delay of the delay time circuit 9a, i.e. the IC.

The built-in logical circuit can be accessed while the IC is being evaluated, by inputting and outputting signals through the external input/output terminals IP and OP connected to the input/output circuit of the input/output buffer circuit region 5. Signals which are input into the input terminal IP and output from the output terminal OP are transmitted through the input/output circuit, the controller, and the built-in input/output terminals IC1 and OC1, without passing through the delay elements 17. That is, data signals which are input into the test terminal for data signal input IN are transmitted within the input/output control circuit region 2 of the input/output buffer circuit without passing through the built-in logical circuit region 1, and are output from the test terminal for data signal output OUT.

Figure 4:
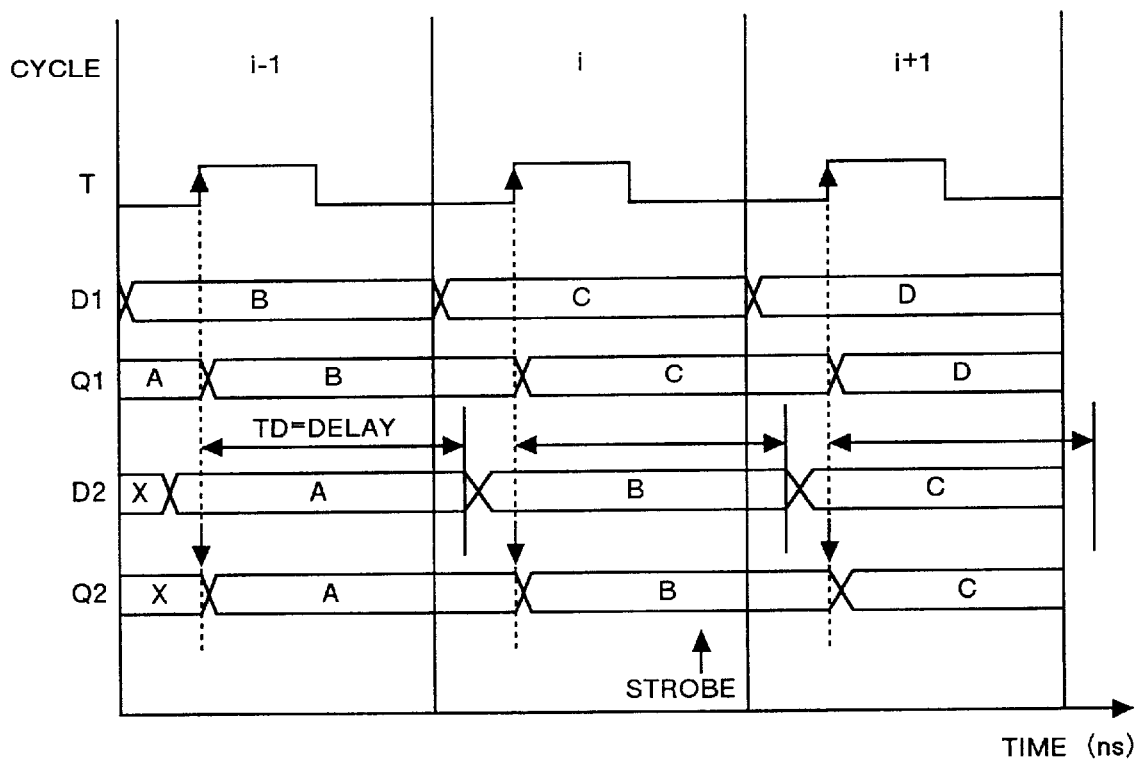
FIG. 4 is a timing chart showing the operation of the delay monitor circuit according to the first embodiment.

Operation of the delay monitor circuit 2a will be explained with reference to timing chart in FIGS. 4 and 5. Two cases, that is, when data signal is correctly transmitted and when it is incorrectly transmitted, are considered. FIG. 4 is a timing chart showing the operation of the delay monitor circuit 2a when the data signal is correctly transmitted. At the rise of the clock signal (from the clock signal input terminal T) in the (i−1)-th cycle (a predetermined cycle), the signal (logical level B) of the data input terminal D1 of the L-FF circuit 12 is latched, whereby the logical level of the signal of the data output terminal Q1 of the L-FF circuit 12 changes from A to B.

Next, the signal (logical level B) of the data output terminal Q1 is transmitted via the delay circuit 9a to the data input terminal D2 of the C-FF circuit 13. When the time (delay time) taken by the signal to pass through the delay circuit 9a is expressed as Td, the logical level of the signal of the data input terminal D2 of the C-FF circuit 13 changes from A to B after time Td has elapsed since the rise of the clock signal in the (i−1)-th cycle.

Similarly, at the rise of the clock signal in the i-th cycle (the cycle immediately after the (i−1)-th cycle) and the (i+1)-th cycle (the cycle immediately after the i-th cycle), the logical level of the signal from the data output terminal Q1 of the L-FF circuit 12 changes from B to C, and from C to D respectively. These data changes (changes in the logical level) are transmitted via the delay circuit 9a to the data input terminal D2 of the C-FF circuit 13 after elapse of the time Td. A, B, C, and D are high or low logical levels.

On the other hand, the C-FF circuit 13 latches the signal of the data input terminal D2 at the rise of the same clock signal used in the L-FF circuit 12, and outputs the latched signal to the data output terminal Q2. The data transmission is verified by supplying a data signal and a clock signal for performing the operations mentioned above to the data input terminal D1 and the clock input terminal T of the L-FF circuit 12, and checking the signal of the data output terminal Q2 of the C-FF circuit 13 to determine whether the data has been correctly transmitted.

In this example, the logical level of the signal of the data input terminal D2 of the C-FF circuit 13 changes from A to B after the time Td has elapsed since the rise of the clock signal in the (i−1)-th cycle, before the rise of the clock signal of the i-th cycle. Thereafter, the signal (logical level B) from the data input terminal D2 is latched at the rise of the clock signal in the i-th cycle, and output to the data output terminal Q2. After the rise of the clock signal in the i-th cycle, it is possible to confirm whether the data signal has been correctly transmitted by measuring the signal of the data output terminal Q2, and confirming that it is at the logical level B.

That is, the logical level of the signal of the data input terminal D1 of the L-FF circuit 12 in the (i−1)-th cycle is treated as an expected value (EXPECT), and it is determined whether a measured level (STROBE) of the signal of the data output terminal Q2 of the C-FF circuit 13, taken after the rise of the i-th cycle clock signal, matches the expected value. In this example, since the delay Td of the delay circuit 9a is shorter than one cycle of the clock signal, the expected value will match the strobe and this will mean that the data signal has been correctly transmitted.

Figure 5:
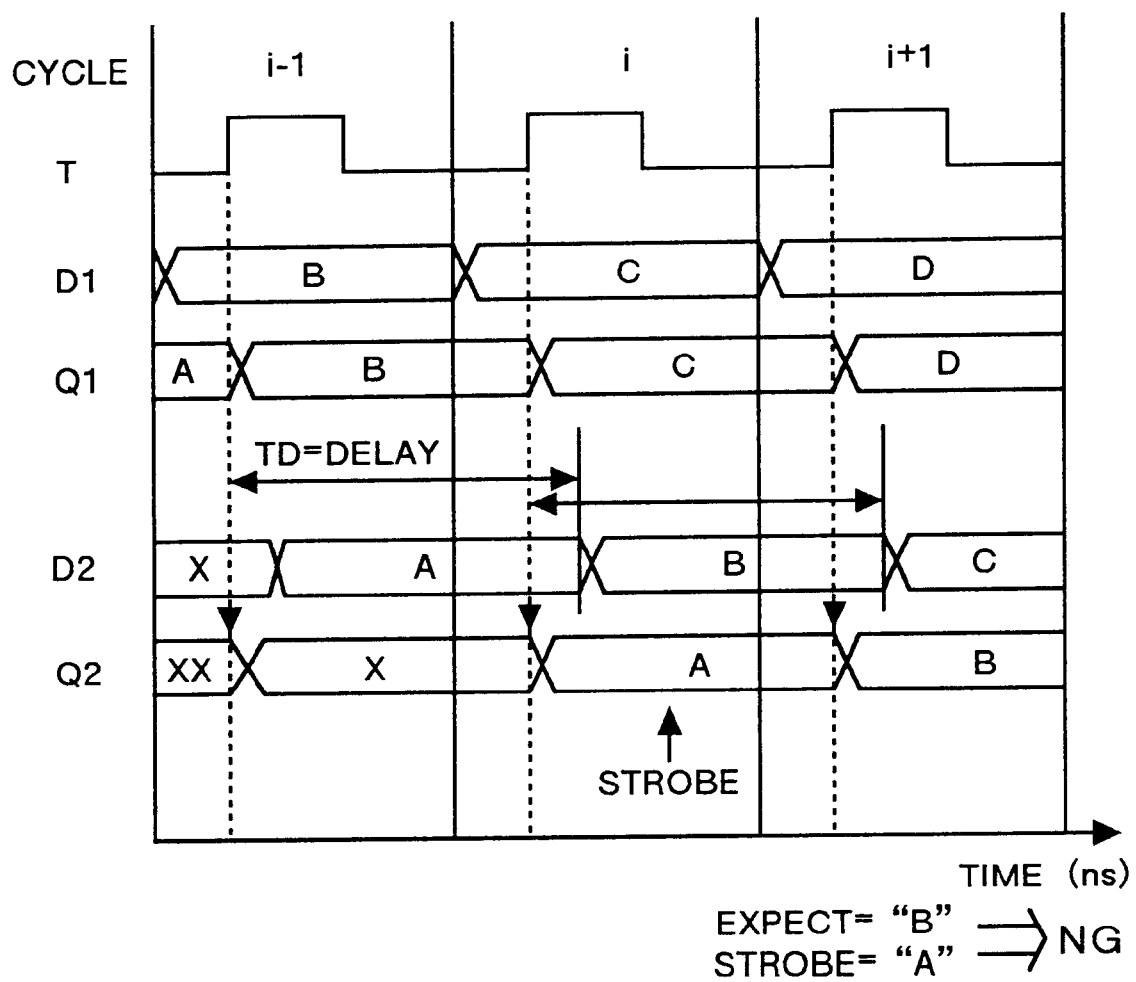
FIG. 5 is a timing chart showing the operation of a delay monitor circuit according to the first embodiment.

FIG. 5 is a timing chart showing the operation of the delay monitor circuit 2a when the data signal is not correctly transmitted. Since the cycle of the clock signal is shorter than the delay Td of the delay circuit 9a, the clock signal in the i-th cycle rises before the logical level of the signal from the data input terminal D2 of the C-FF circuit 13 changes from A to B at a time which is time Td after the rise of the clock signal in the (i−1)-th cycle. Consequently, the signal at the logical level A is latched at the rise of the clock signal in the i-th cycle, whereby a signal at the logical level A is output to the data output terminal Q2.

Then, after the rise of the clock signal in the i-th cycle, the logical level of the signal output from the data output terminal Q2 is measured. Since the logical level will not be equal to the logical level B, it will be determined that the transmission of the data signal is incorrect. In this example, since the delay time Td of the delay circuit 9a is longer than one cycle of the clock signal, the expected value does not match the measured one, and it is determined that the data signal has been incorrectly transmitted. That is, the shortest clock signal cycle in which a data signal can be correctly transmitted approximately matches the delay Td of the delay circuit 9a.

By determining whether or not the data signal has been correctly transmitted after changing the clock signal input into the delay monitor circuit 2a in this way, it is possible to evaluate the operating speed of the IC comprising the delay monitor circuit 2a. That is, provided that the data signal can be correctly transmitted even when the clock signal is short, it can be determined that the operating speed of the IC is fast, and that the transistor (Tr) characteristics and interconnections (Al interconnections) are good.

Furthermore, when test standards exist in order to guarantee customers of the operating speed of the IC, the cycle of the clock signal need only be set in accordance with the test standards. By determining whether a data signal has been correctly transmitted, defective products (IC with low manufacturing process performance and unsatisfactory operating speed) can be detected. Furthermore, the operating speed can be evaluated in this way for the entire IC, and the transistor characteristics and state of the interconnections in the entire IC can be evaluated, enabling the reliability of the IC to be improved.

Figure 6:
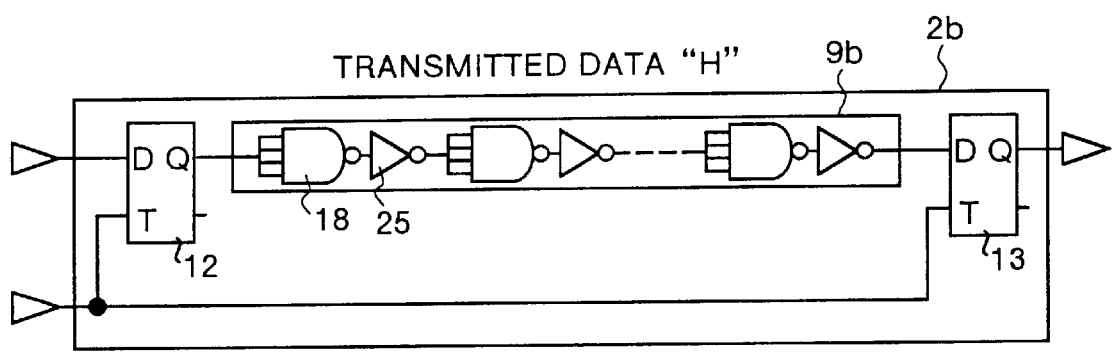
FIG. 6 is a diagram showing a circuit of another delay monitor circuit according to the first embodiment.
Figure 7:
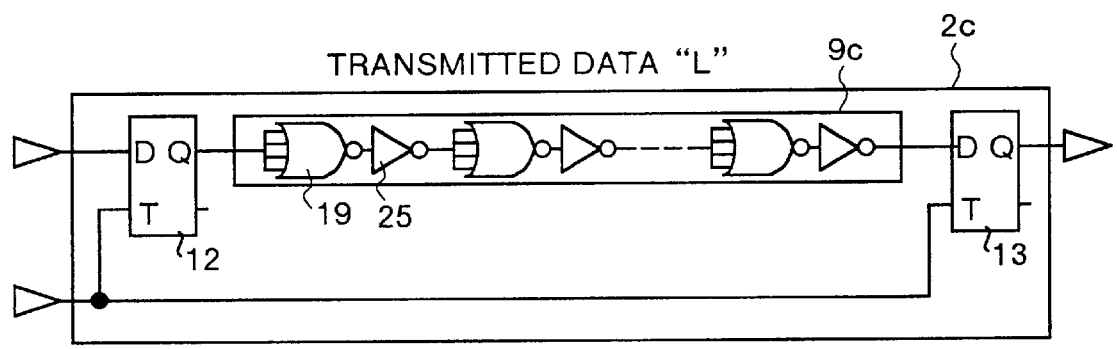
FIG. 7 is a diagram showing a circuit of still another delay monitor circuit according to the first embodiment.
Figure 8:
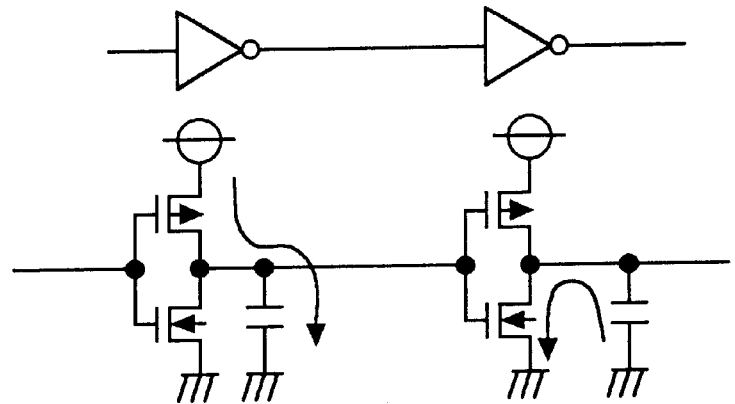
FIG. 8 is a diagram explaining the operation of the delay monitor circuit according to the first embodiment.

Next, the operation will be explained when the delay circuit 9a of the delay monitor circuit 2a has a different configuration. The delay circuit 9a may comprise only inverters, or it may have alternately connected four-input NAND gates 18 and inverters 25 as shown in FIG. 6 (delay circuit 9b), or it may have alternately connected four-input NOR gates 19 and inverters 25 as shown in FIG. 7 (delay circuit 9c). For example, in the delay circuit 9a having only inverters, as shown in FIG. 8, the ratio between the operating N-channel transistors and P-channel transistors is 1:1.

Figure 9:
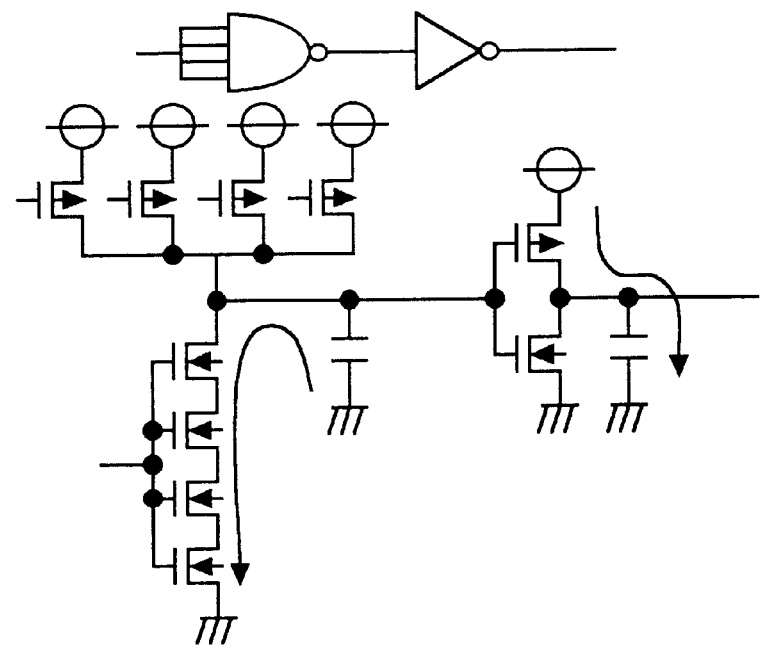
FIG. 9 is a diagram explaining the operation of another delay monitor circuit according to the first embodiment.
Figure 10:
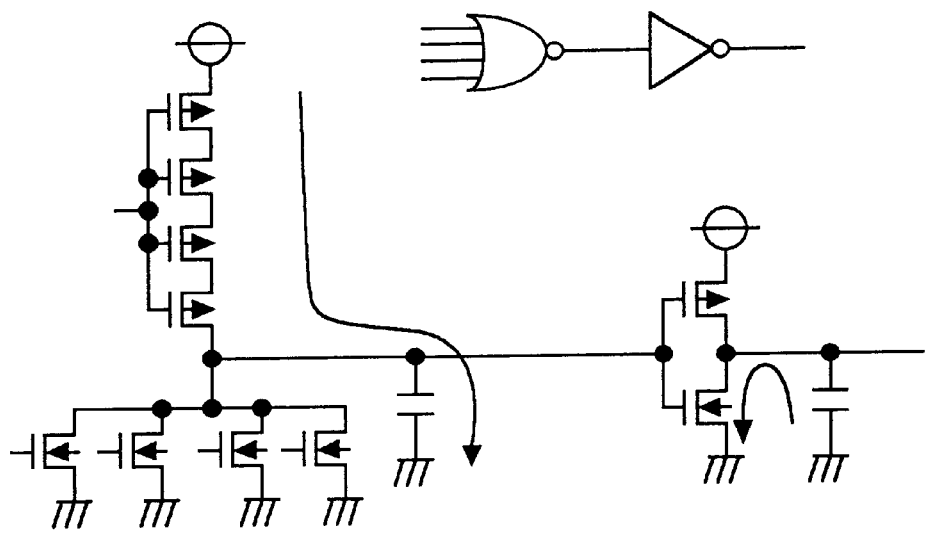
FIG. 10 is a diagram explaining the operation of still another delay circuit according to the first embodiment.

On the other hand, as shown in FIG. 9, in the delay circuit 9b having alternately connected four-input NAND gates 18 and inverters 25, when the data signal to be transmitted is at the high level (H), the ratio between the operating N-channel transistors and P-channel transistors is 4:1. As a consequence, the characteristics of the N-channel transistors can be measured more precisely. On the other hand, as shown in FIG. 10, in the delay circuit 9c having alternately connected four-input NOR gates 19 and inverters 25, when the data signal to be transmitted is at the low level (L), the ratio between the operating N-channel transistors and P-channel transistors is 1:4. As a consequence, the characteristics of the P-channel transistors can be measured more precisely.

Figure 11:
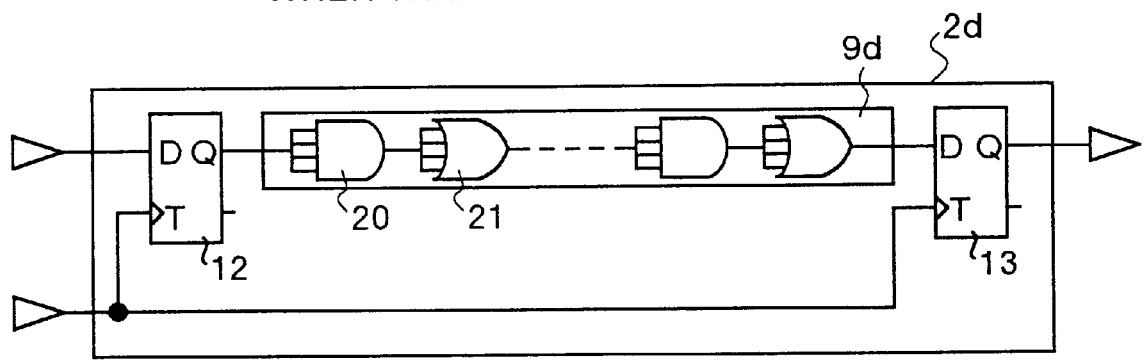
FIG. 11 is a diagram showing a circuit of still another delay monitor circuit according to the first embodiment.

Moreover, as shown in FIG. 11, when a delay circuit (delay circuit 9d) has alternately connected four-input AND gates and four-input OR gates, by switching the logical level of the transmitted data signal (i.e. switching between the low level and the high level) it is possible to switch the ratio between the operating N-channel transistors and P-channel transistors using the single delay circuit 9d. As a consequence, the characteristics of the operating N-channel transistors and P-channel transistors can be precisely measured by the single delay circuit 9d. There are no particular restrictions on the constitution of the delay circuit, and by using a variety of constitutions it is possible to vary the ratio between the operating N-channel transistors and P-channel transistors, and to measure in detail their respective characteristics.

As described above, according to the first embodiment, since flip-flops are provided on either side of the delay circuit, the operating speed can be measured without taking into consideration the effects of delay in the input/output buffers. In addition, by changing the constitution of the delay circuit it is possible to measure not only an average operating speed of the N-channel transistors and the P-channel transistors, but also the separate operating speed of individual N-channel and P-channel transistors. As a result, process characteristics can be evaluated with high precision and in great detail.

Furthermore, when the delay circuit is provided in the input/output control circuit region of the input/output buffer circuit region, the built-in logical circuit region in which the delay circuit was conventionally provided can be used as a built-in logical circuit, thereby easing restrictions on the design and arrangement of the built-in logical circuit. That is, the built-in logical circuit can be designed without concern for the arrangement of the interconnections of the delay circuit. Furthermore, the interconnections between the delay elements of the delay circuit can be made constant to a certain extent, reducing the effects of variation in the lengths of the interconnections on the measurement, and making it possible to evaluate the effect of the transistor characteristics on the operating speed.

The input and output circuits 14, 15, and 16 connected to the delay monitor circuit 2a, and the pads therein, may be provided at the corners of the IC. Consequently, there is no need to provide test terminals which are not used by customers but are only used for testing the operating speeds of ICs to identify defective products, and the like, in the IC package, making it possible to reduce the pin of the IC package. The size of the transistors forming the delay circuit may differ from the size of the transistors forming the built-in logical circuit. However, when these transistors are of the same size, the operating speed can be measured under conditions closer to that of an actual built-in logical circuit, making it possible to more accurately evaluate the characteristics of the built-in logical circuit.

Figure 12:
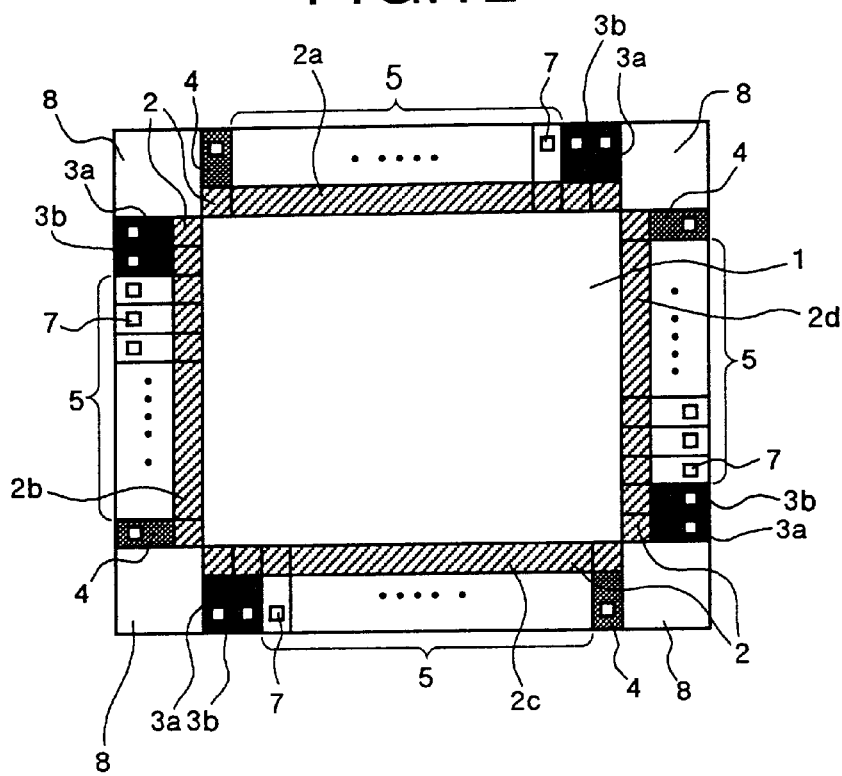
FIG. 12 is a diagram showing a chip arrangement of a semiconductor integrated circuit according to a second embodiment of this invention.

A second embodiment according to this invention comprises many delay monitor circuits each of a different type provided in input/output control circuit regions of the input/output buffer circuit regions. The constitution and operation of the second embodiment will be explained here. FIG. 12 shows chip arrangement of the IC according to the second embodiment. Since the constitution is basically the same as that of the first embodiment, only the differing parts will be explained. Parts which are identical to the first embodiment will be represented by the same legends used in FIG. 1, and they will not be explained. In this IC, delay monitor circuits of different types are provided in the input/output buffer circuit regions at the four sides of the IC. In addition, the input/output buffer circuit regions for test terminals 3a, 3b, and 4 comprise the input circuits for test terminals 14, 15, and 16, and are provided on each of the four sides. Input/output buffer circuit regions 5 comprise elements forming delay monitor circuits and are similarly provided on each side.

There are no particular restrictions on the type and number of the delay monitor circuits provided in the input/output buffer circuit regions of each side. For example, the delay monitor circuit 2a having the delay circuit 9a having only inverters, the delay monitor circuit 2b having the delay circuit 9b having alternately connected four-input NAND gates 18 and inverters 25, the delay monitor circuit 2c having the delay circuit 9c having alternately connected four-input NOR gates 19 and inverters 25, and the delay monitor circuit 2d having the delay circuit 9d having alternately connected four-input AND gates and four-input OR gates, may be provided.

Alternatively, many delay monitor circuits of the same type may be provided. Furthermore, the delay monitor circuits may be provided in the input/output buffer circuit regions on three sides or two sides, rather than all four sides. In addition, many delay monitor circuits may be provided in one side. Furthermore, the delay monitor circuits may be spread across multiple sides. The multiple delay monitor circuits of multiple types have independent constitutions and operate separately, enabling them to be separately evaluated. The operation of the delay monitor circuits is the same as the delay circuit of the first embodiment, therefore, their explanation will be omitted.

As mentioned above, in addition to the effects of the first embodiment, the second embodiment enables the IC to be evaluated at a higher precision and in greater detail, since many types of delay monitor circuits are provided in one IC, evaluation of this single IC enables evaluation of many types of delay monitor circuits.

Figure 13:
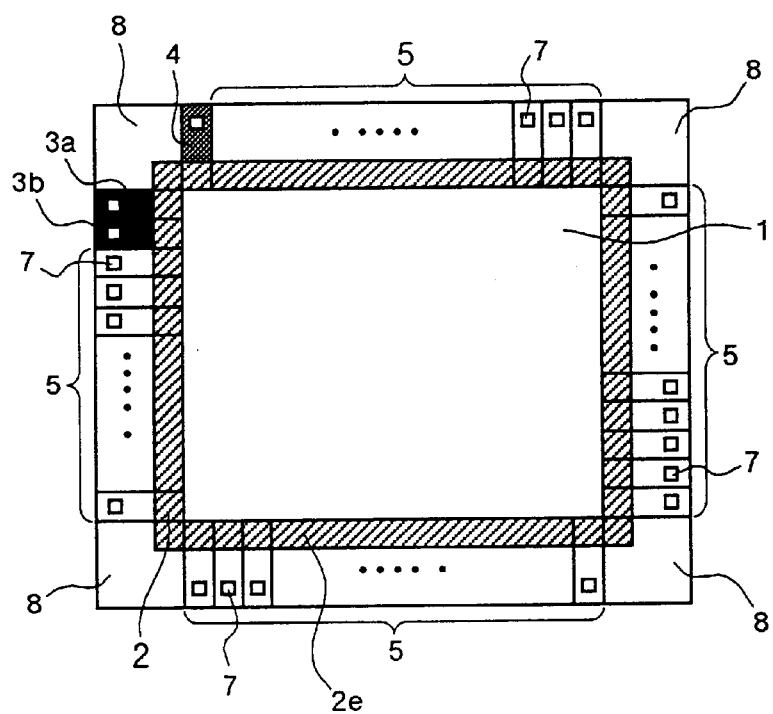
FIG. 13 is a diagram showing a chip arrangement of a semiconductor integrated circuit according to a third embodiment of this invention.

As a third embodiment of this invention, the delay monitor circuit of first embodiment is provided in the from of a ring around the input/output buffer circuit regions on the four sides of the IC. The constitution and operation of the third embodiment will be explained here. FIG. 13 shows chip arrangement of the IC according to the third embodiment. Since the constitution is basically the same as that of the first embodiment, only the differing parts will be explained. Parts which are identical to the first embodiment will be represented by same legends as in FIG. 1, and their explanation will be omitted.

In this IC, a delay monitor circuit 2e is provided in the from of a ring around the input/output buffer circuit regions 2 on the four sides of the IC. The delay monitor circuit 2e has a similar constitution to the delay monitor circuits 2a through 2f, and is provided in a ring-like shape around the IC. In this IC, the input/output buffer circuit region 5 having the input/output control circuit region 2 in which elements forming the delay monitor circuit 2e are provided extends in a ring-like shape around the four sides of the IC. The input buffer circuit regions 3a, 3b, and 4 comprise the input/output circuits for test terminals, and are provided adjacent to each other.

Since the input buffer circuit regions 3a, 3b, and 4, are adjacent to each other (i.e. since the L-FF circuit 12 and the C-FF circuit 13 are adjacent to each other), the guides for the interconnections of the clock signal input to the L-FF circuit 12 and the C-FF circuit 13 can be shortened. This IC operates in the same manner as the IC of the first embodiment. To evaluate the IC, a data signal for testing is transmitted through the ring within the IC.

According to this third embodiment, in addition to the effects of the first embodiment, it is not necessary to extend the interconnection of the clock signal. This reduces the delay of the clock signal resulting from the capacity of the interconnection guide, making it possible to measure the delay more accurately, and simplifying the interconnections of the delay monitor circuit itself.

Figure 14:
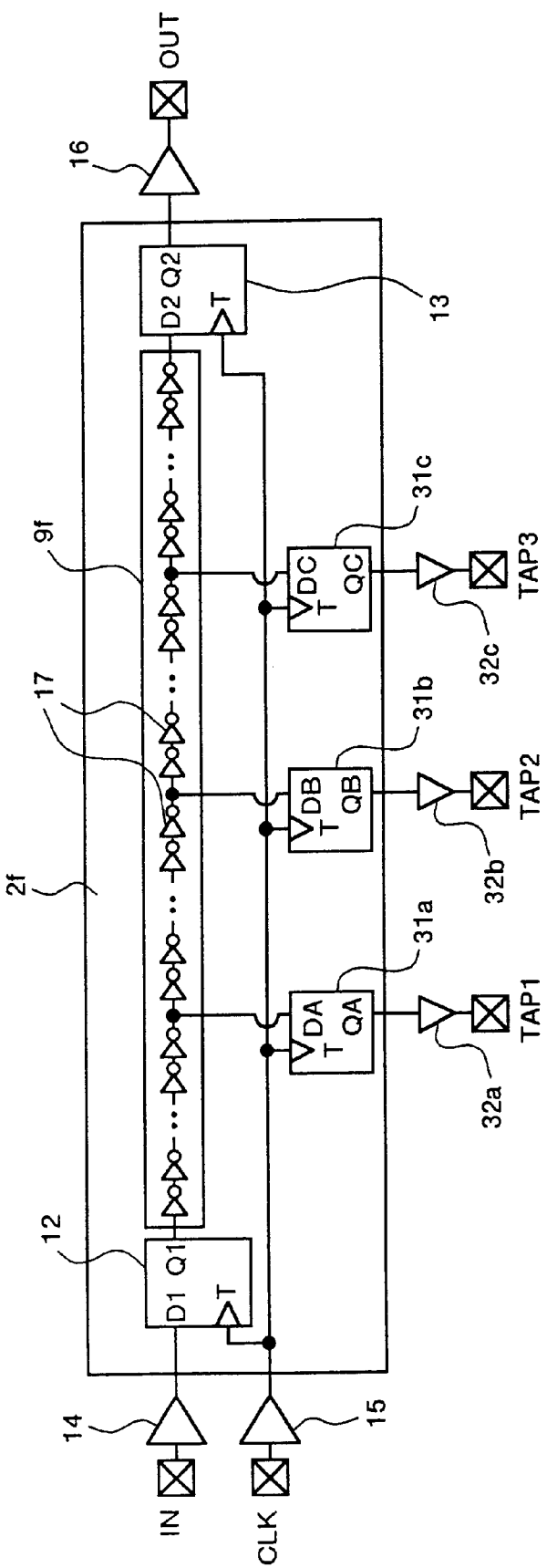
FIG. 14 is a diagram showing a circuit constitution of a delay monitor circuit according to a fourth embodiment of this embodiment.
Figure 15:
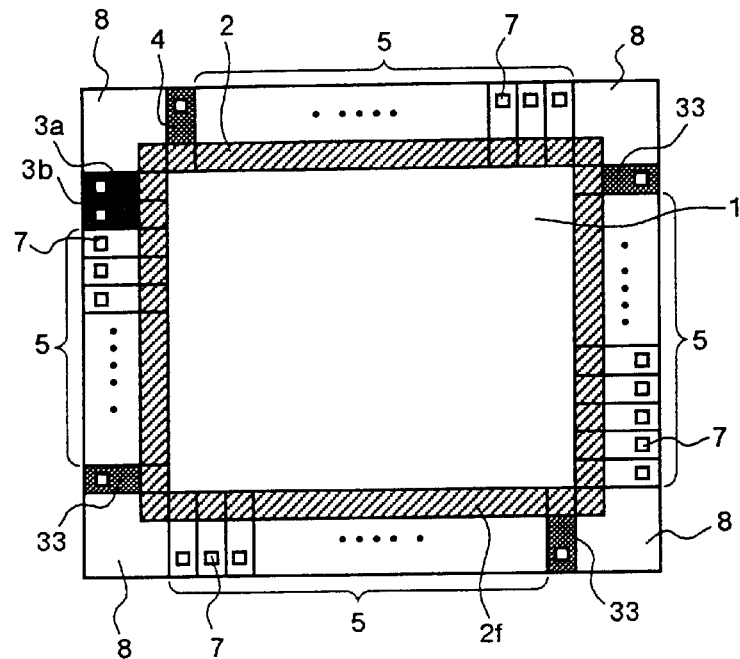
FIG. 15 is a diagram showing a chip arrangement of a semiconductor integrated circuit according to the fourth embodiment of this invention.

As a fourth embodiment of this invention, in the third embodiment, it is possible to monitor a data signal by extracting midway through the delay monitor circuit. The constitution of the fourth embodiment will be explained here. FIG. 14 shows circuit constitution of the delay monitor circuit according to the fourth embodiment. FIG. 15 shows chip arrangement of the IC according to the fourth embodiment. Since the constitution is basically the same as that of the first and third embodiments, only the differing parts will be explained. Parts which are identical to those of the first and third embodiments will be represented by the same legends used in FIG. 3 and FIG. 13, and explanation will be omitted.

Instead of the delay circuit 9a of the first embodiment, the delay monitor circuit 2f comprises a delay circuit 9f formed by elongating the constitution of the delay circuit 9a so as to extend around the perimeter of the IC. Furthermore, at least one C-FF circuit for intermediate data signal 31a to 31c extracting an intermediate (midway) data signal from the delay monitor circuit 2f is provided. This C-FF circuit(s) for intermediate data signal 31a to 31c receive a data signal from between the delay elements of the delay monitor circuit 2f at their data input terminals DA through DC, receive the same clock signal input to the L-FF circuit 12 and the C-FF circuit 13 at their clock input terminal T, and output the data signal at a timing specified by the input clock signal to output circuits for intermediate data signal 32a though 32c.

The output circuits for intermediate data signal 32a though 32c are provided between the C-FF circuit for intermediate data signal 31a though 31c and test terminals for intermediate data signal TAP1 though TAP3, and output signals from the C-FF circuit for intermediate data signal 31a though 31c to the test terminals for intermediate data signal TAP1 though TAP3. There are no particular restrictions on the position from which the data signal is extracted from between the delay elements, but an intermediate data signal is extracted between the delay elements at the ends of each side. That is, as shown in FIG. 15, output buffer circuit regions for intermediate data signal output terminal 33 comprise the output circuits for intermediate data signal 32a though 32c, and are provided at the ends of the sides of the IC. Consequently, the delay on each side can be measured.

The operation of the fourth embodiment will be explained here. The operation of the fourth embodiment is similar to that of the third embodiment, in that the data signals for testing are transmitted through the delay monitor circuit 2f and around the IC. During transmission, the data signals are input at the end of each side to the C-FF for intermediate data signal 31a though 31c, and latched by the same clock signal which is supplied to the L-FF circuit 12 and the C-FF circuit 13. The data signals then pass through the output circuits for intermediate data signal 32a though 32c, and are output to the outside from the test terminals for intermediate data signal TAP1 though TAP3. That is, by changing the cycle of the clock signal, the delay can be measured at individual points and throughout the entire IC, and evaluated on each side.

According to this fourth embodiment, in addition to the effects of the first and third embodiments, the delay can be measured by extracting an intermediate data signal (i.e. a data signal which is midway through the delay monitor circuit), the delay monitor circuit is provided in a ring around the IC, and intermediate data signals are extracted from the input/output buffer circuit regions at the ends of the four sides. Therefore, when the number of delay elements in each side and the length of the interconnections between the delay elements is constant, it is possible to evaluate variation in the transistor characteristics and the state of the interconnections within the IC.

Furthermore, since multiple test terminals for data signal output are provided for one test terminal for data signal input, the number of test terminals is lower than when the delay monitor circuits are provided separately on each side. The intermediate data signals may be extracted from a delay monitor circuit which is not provided in a ring-like shape, as in the first embodiment, or multiple delay monitor circuits may be provided as in the second embodiment, and intermediate data signals extracted from all or some of these delay monitor circuits. Moreover, the output circuits for intermediate data signal 32a though 32c may be provided at the corners 8 together with the input or output circuits 14, 15, and 16. Because of the provision of such an arrangement, the IC package need not comprise test terminals which are not used by the customer but are only used for testing the operating speeds of ICs to identify defective products, and the like, making it possible to reduce the pin of the IC package.

Figure 16:
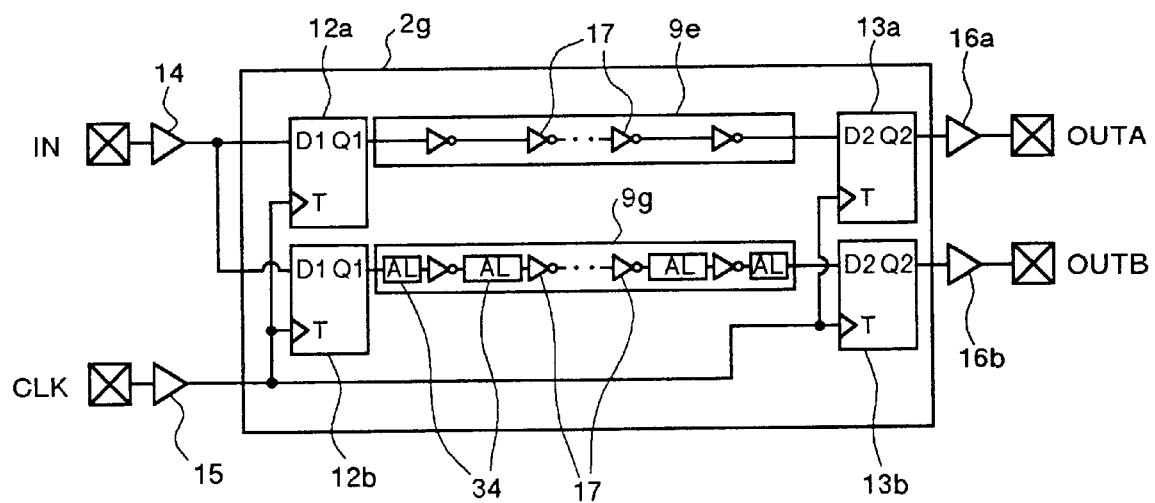
FIG. 16 is a diagram showing a circuit of a delay monitor circuit according to a fifth embodiment of this embodiment.
Figure 17:
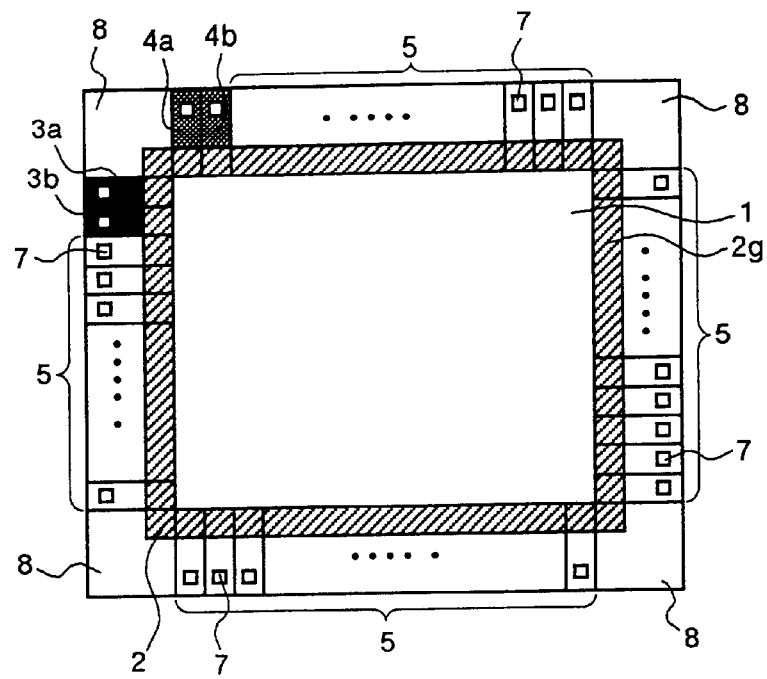
FIG. 17 is a diagram showing a chip arrangement of a semiconductor integrated circuit according to the fifth embodiment of this embodiment.

As a fifth embodiment according to this invention, in the third embodiment, many types of delay circuits having interconnections of different lengths between their delay elements are provided. The constitution of the fifth embodiment will be explained here. FIG. 16 shows circuit constitution of the delay monitor circuit according to the fifth embodiment. FIG. 17 shows chip arrangement of the IC according to the fifth embodiment. Since the constitution is basically the same as that of the first and the third embodiments, only the differing parts will be explained. Parts which are identical to those of the first and third embodiments will be represented by same legends as used in FIG. 3 and FIG. 13, and their explanation will be omitted.

Instead of the delay circuit 9a of the first embodiment, the delay monitor circuit 2g comprises delay circuits 9e and 9g formed by elongating the constitution of the delay circuit 9a so as to extend around the periphery of the IC. The interconnections between the delay elements of the delay circuit 9e are extremely short. On the other hand, long fixed-length Al (Aluminum) interconnections (wire) 34 are provided in between the delay elements of the delay circuit 9g. That is, the length of the interconnections between the delay circuits 9e and 9g are different. Instead of the L-FF 12 and the C-FF 13, the delay monitor circuit 2g comprises two L-FFs 12a and 12b, and two C-FFs 13a and 13b, corresponding to the two delay circuits 9e and 9g.

The L-FF 12a and the C-FF 13a are provided respectively at the input stage and the output stage of the delay circuit 9e, and the L-FF 12b and the C-FF 13b are provided respectively at the input stage and the output stage of the delay circuit 9g. The L-FF 12a, the C-FF 13a, the L-FF 12b, and the C-FF 13b all received the same clock signal, and are latched by this clock signal. There are no particular restrictions on the number of delay circuit provided to the delay monitor circuit 2g, and delay circuits having interconnections of different lengths may be provided. In such a case, the number of L-FFs and C-FFs corresponds to the number of delay circuits.

In this IC, the output circuit for test terminal 16 is substituted by output circuits for test terminal 16a and 16b, which correspond to the C-FFs 13a and 13b. There are two output buffer circuit regions for test terminal 4a and 4b. The output circuits for test terminal 16a and 16b output data signals from the C-FFs 13a and 13b to test terminals for test signal output OUTA, OUTB.

The operation of the fifth embodiment will be explained here. The L-FF 12a, the delay circuit 9e, and the C-FF 13a perform the same operation as in the third embodiment, and output a data signal to the outside via the output circuit for test terminal 16a. The L-FF 12b, the delay circuit 9g, and the C-FF 13b also perform the same operation as in the third embodiment, and output a data signal to the outside via the output circuit for test terminal 16b. Due to the effect of the appended Al interconnections 34, the delay of the data signal passing through the delay circuit 9g is greater than the delay of the data signal which passes the delay circuit 9e. By measuring and comparing these delays, the effect of the Al interconnections on the operating speed can be evaluated.

According to this fifth embodiment, since many types of delay circuits having delay elements connected by Al interconnections of different lengths are provided, and these delay circuits are operated by the same clock, in addition to the effects of the first and third embodiments, it is possible to evaluate the effect of the AL interconnections on the operating speed of the IC. The many types of delay circuits having interconnections of different lengths between their delay elements may be provided in a delay monitor circuit which is not provided in a ring-like shape, as in the first embodiment, or multiple delay monitor circuits may be provided as in the second embodiment, and multiple types of delay circuits having interconnections of different lengths between their delay elements may be provided in all or some of these delay monitor circuits.

Figure 18:
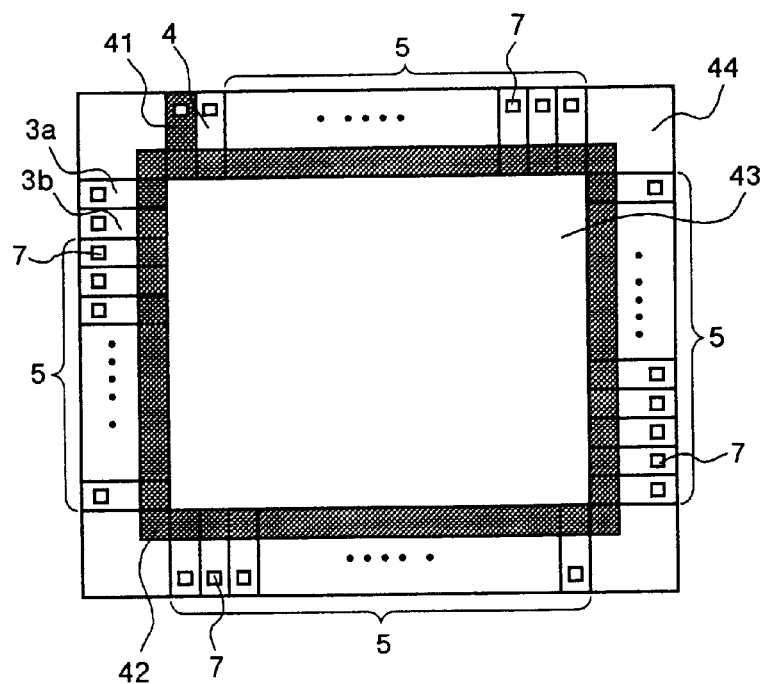
FIG. 18 is a diagram showing a chip arrangement of a semiconductor integrated circuit according to a sixth embodiment of this invention.
Figure 19:
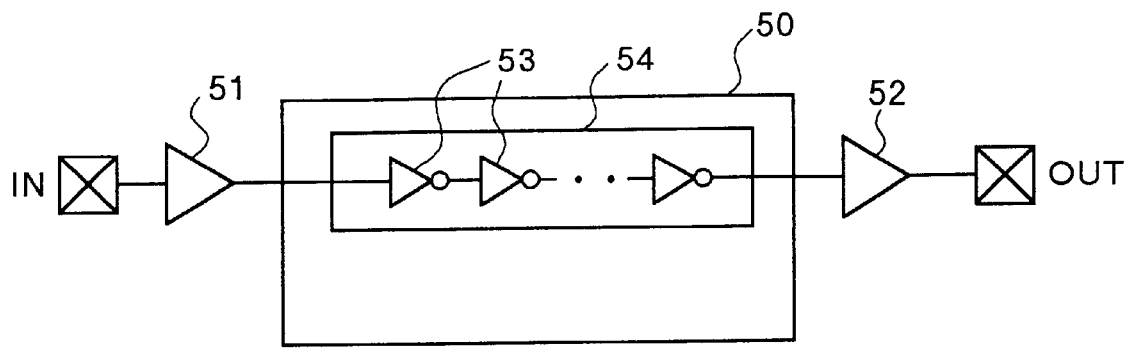
FIG. 19 is a diagram showing a circuit of a conventional delay monitor circuit.
Figure 20:
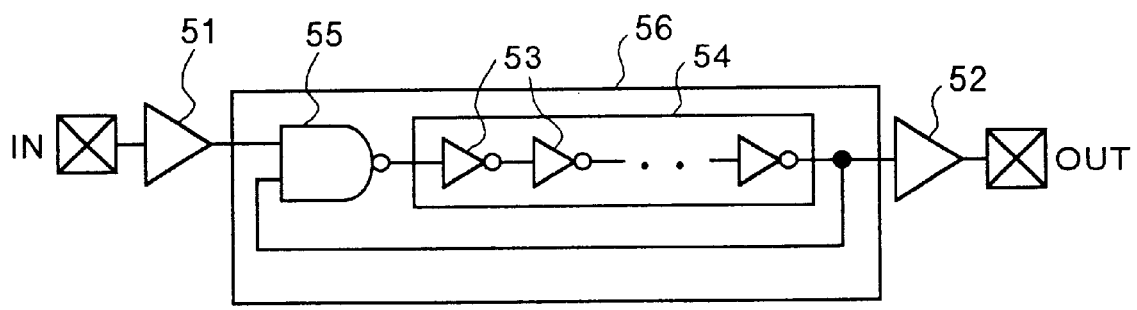
FIG. 20 is a diagram showing a circuit of another conventional delay monitor circuit.
Figure 21:
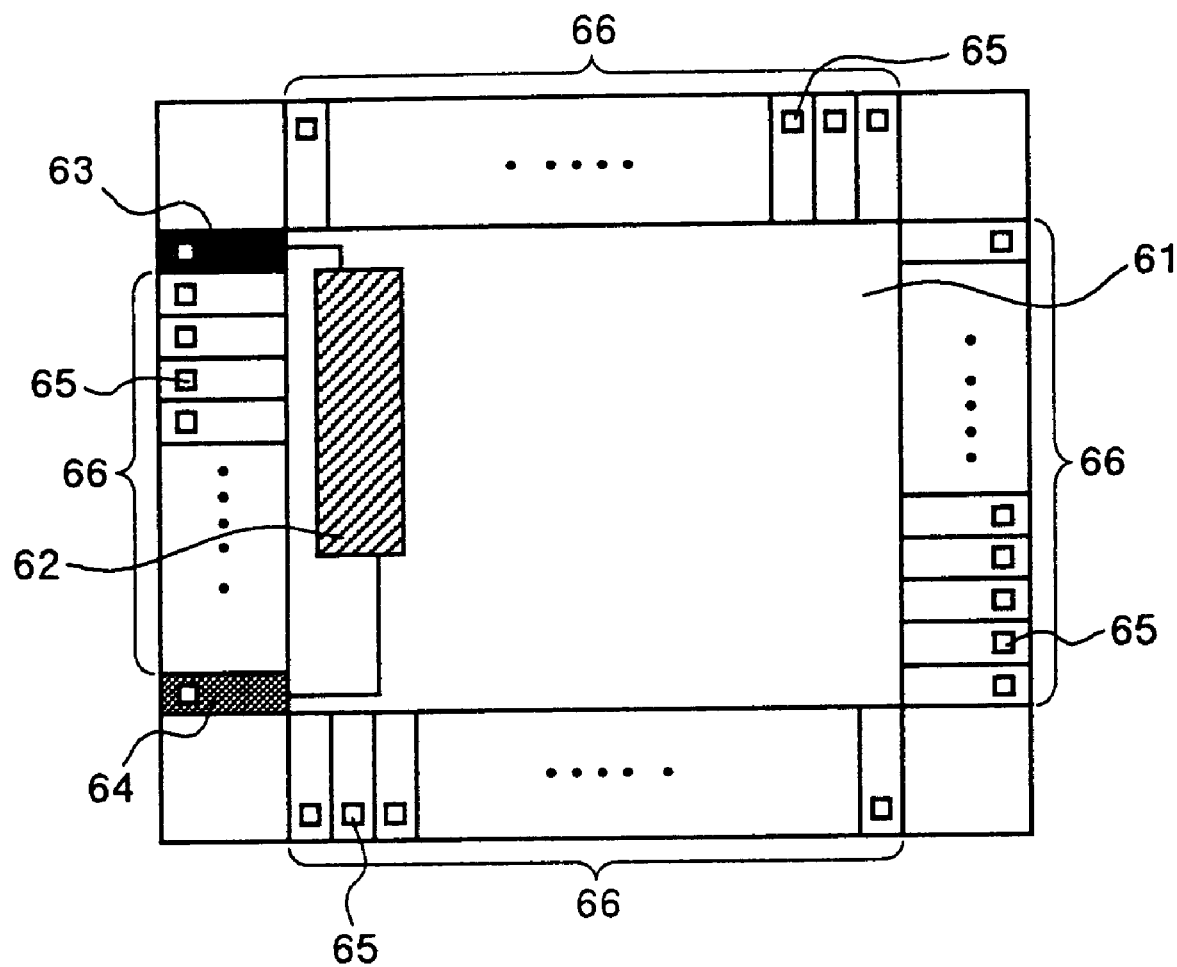
FIG. 21 is a diagram showing a chip arrangement of a conventional semiconductor integrated circuit.

As a sixth embodiment, in the first to fifth embodiments, the power for the built-in logical circuits in the IC and the input/output circuits is provided separately from the power for the delay monitor circuits. The constitution and operation of the sixth embodiment will be explained. FIG. 18 shows chip arrangement of the IC according to the sixth embodiment.

In this IC, a delay monitor circuit power source 41 supplies electrical power to the delay monitor circuit, and is provided separately from the built-in logical circuits and the input/output circuits. Furthermore, a delay monitor circuit power region 42 is provided separately from a built-in logical circuit power region 43 for the built-in logical circuit, and an input/output power region 44 for the input/output circuits. For example, when the delay monitor circuit has a ring-like shape, the delay monitor circuit power region 42 is also provided in a ring-like shape. The constitution and operation of the delay circuit is the same as that in the first to fifth embodiments.

According to this sixth embodiment, since the power for the delay monitor circuit is provided separately from the power for operating the built-in logical circuits and the input/output circuits, the delay circuit can be operated with less influence from noise from the built-in logical circuit and the input/output circuits, achieving a more accurate evaluation of the IC, in addition to the effects of the first to fifth embodiments already described.

As described above, according to one aspect of this invention, a monitor circuit having flip-flop circuits in the input/output stages of its delay circuit is provided in an input/output buffer circuit region. Therefore, P-channel transistors and N-channel transistors can be individually monitored without being affected by the delay of the input/output circuits, and, since there is no need to provide a monitor circuit in the built-in logical circuit region, the semiconductor integrated circuit can be evaluated at high precision and in great detail. A further advantage is that the design region of the built-in logical circuit can be reduced, lowering costs without increasing the restrictions on the arrangement of the interconnections.

Further, monitors of many types having delay circuits of different types are provided. Therefore, one semiconductor integrated circuit can be evaluated using a variety of delay circuits, enabling the semiconductor integrated circuit to be evaluated in more detail.

Further, a ring-like monitor is provided around the semiconductor substrate, making it possible to form a monitor circuit which longer than when provided on one side. Since the clock signal guide can be shortened, the semiconductor integrated circuit can be evaluated with higher precision.

Further, the output can be extracted from midway through the delay circuit of the monitor circuit, enabling transistor characteristics of the semiconductor integrated circuit and the state of the interconnections to be evaluated, and increasing the detail of the evaluation of the semiconductor integrated circuit. When no evaluation is required after packaging, fewer package test terminals are needed than when multiple monitors are provided.

Further, the size of the transistors comprising the delay circuit is the same as the size of the transistors comprising a built-in logical circuit of the semiconductor integrated circuit. Therefore, the evaluation can be carried out under conditions closer to that of a built-in logical circuit, making it possible to evaluate the semiconductor integrated circuit more precisely.

Further, the monitor circuit comprises many types of delay circuits having interconnections of different lengths between their delay elements. Therefore, it is possible to evaluate the effect of the interconnections on the speed of the semiconductor integrated circuit, achieving a more detailed evaluation of the semiconductor integrated circuit.

Further, the monitor circuit comprises a delay circuit in which fixed-length interconnections are provided between the delay elements to increase the length of wiring, and a delay circuit in which the interconnections between the delay elements are as short as possible. Therefore, it is possible to evaluate the effect of the interconnections on the speed of the semiconductor integrated circuit, achieving a more detailed evaluation of the semiconductor integrated circuit.

Further, the power for the monitor circuit is provided separately from the power for the built-in logical circuits and the input/output circuits of the semiconductor integrated circuit. Therefore, effects of noise and the like from the built-in logical circuit and the input/output buffer circuits can be reduced, achieving a highly precise evaluation of the semiconductor integrated circuit.

Further, the input/output buffer circuit for the monitor circuit and the pads therein are provided at the corners of the semiconductor integrated circuit. Therefore, when no evaluation is required after packaging, the number of package test terminals can be reduced.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor integrated circuit comprising:

a semiconductor substrate on which various components can be mounted;

an input/output buffer circuit region on said semiconductor substrate; and a monitor circuit to be evaluated and located in said input/output buffer circuit region, wherein said monitor circuit comprises a delay circuit, a first flip-flop circuit located at an input side of said delay circuit, and a second flip-flop circuit located at an output side of said delay circuit.

2. The semiconductor integrated circuit according to claim 1, wherein a plurality of different monitor circuits are included in said input/output buffer circuit region, and each of said monitor circuits has a different delay circuit.

3. The semiconductor integrated circuit according to claim 1, wherein said monitor circuit has a ring shape on said semiconductor substrate.

4. The semiconductor integrated circuit according to claim 1, wherein said monitor circuit extracts an output from within said delay circuit.

5. The semiconductor integrated circuit according to claim 1, including a built-in logic circuit comprising transistors, wherein said delay circuit comprises transistors and sizes of transistors comprising said delay circuit and comprising said built-in logic circuit are substantially identical.

6. The semiconductor integrated circuit according to claim 1, wherein said monitor circuit comprises a plurality of different delay circuits having delay elements and interconnections of different lengths interconnecting said delay elements.

7. The semiconductor integrated circuit according to claim 1, wherein said monitor circuit comprises a first delay circuit comprising delay elements and fixed-length interconnections interconnecting the delay elements, and a second delay circuit including delay elements and interconnections interconnecting the delay elements of said second delay circuit shorter than the fixed-length interconnections.

8. The semiconductor integrated circuit according to claim 1, including a built-in logic circuit and an input/output buffer circuit wherein power for said monitor circuit is provided separately for said built-in logic circuit and for said input/output buffer circuit.

9. The semiconductor integrated circuit according to claim 1, including an input/output buffer circuit and wherein pads of said monitor circuit are located at corners of said semiconductor substrate.

10. A semiconductor integrated circuit comprising:

a semiconductor substrate on which various components can be mounted;

an input/output buffer circuit region on said semiconductor substrate;

at least one built-in logic circuit; and a monitor circuit to be evaluated and located in said input/output buffer circuit region, wherein said monitor circuit comprises at least one delay circuit, a first flip-flop circuit located at an input side of said delay circuit, and a second flip-flop circuit located at an output side of said delay circuit.

11. The semiconductor integrated circuit according to claim 10, including a plurality of different monitor circuits are included in said input/output buffer circuit region, and each of said monitor circuits has a different delay circuit.

12. The semiconductor integrated circuit according to claim 10, wherein said monitor circuit has a circle shape on said semiconductor substrate.

13. The semiconductor integrated circuit according to claim 10, wherein each of said delay circuit and said built-in logic circuit has at least one transistor, and said transistors comprising said delay circuit and comprising said built-in logic circuit are substantially identical in size.

14. The semiconductor integrated circuit according to claim 10, wherein said delay circuit has many delay elements connected to each other with interconnections of different lengths, and said monitor circuit comprises a plurality of different delay circuits.

15. The semiconductor integrated circuit according to claim 14, wherein said delay circuit has an internal output terminal from which said monitor circuit can extract an output signal.

16. The semiconductor integrated circuit according to claim 14, wherein said delay elements are selected from the group consisting of inverters and four-input NAND gates, four-input NOR gates, four-input AND gates, and combinations thereof.

17. The semiconductor integrated circuit according to claim 10, wherein said monitor circuit comprises first and second delay circuits, said first delay circuit has many delay elements connected to each other with fixed-length interconnections having a fixed-length, and said second delay circuit has many delay elements connected to each other with interconnections shorter than the fixed-length interconnections.

18. The semiconductor integrated circuit according to claim 10 further comprising:

a first power unit which supplies power to said monitor circuit;

a second power unit which supplies power to said built-in logic circuit; and a third power unit which supplies power to said input/output buffer circuit.

19. The semiconductor integrated circuit according to claim 16, wherein said monitor circuit has a plurality of input/output buffer circuits and a plurality of pads, and said input/output buffer circuits and said pads of said monitor circuit are located at corners of said semiconductor substrate.

* * * * *